US010745525B2

(12) United States Patent
Eckel

(10) Patent No.: US 10,745,525 B2
(45) Date of Patent: *Aug. 18, 2020

(54) RESIN FORMULATIONS FOR POLYMER-DERIVED CERAMIC MATERIALS

(71) Applicant: HRL Laboratories, LLC, Malibu, CA (US)

(72) Inventor: Zak C. Eckel, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/190,313

(22) Filed: Nov. 14, 2018

(65) Prior Publication Data

US 2019/0077921 A1 Mar. 14, 2019

Related U.S. Application Data

(63) Continuation of application No. 15/406,762, filed on Jan. 15, 2017, now Pat. No. 10,221,284.

(60) Provisional application No. 62/279,472, filed on Jan. 15, 2016.

(51) Int. Cl.
| | |
|---|---|
| *C08F 2/46* | (2006.01) |
| *C08F 2/50* | (2006.01) |
| *C08G 61/04* | (2006.01) |
| *C08G 77/50* | (2006.01) |
| *C04B 35/56* | (2006.01) |
| *C04B 35/571* | (2006.01) |
| *C04B 35/58* | (2006.01) |
| *C04B 35/583* | (2006.01) |
| *C04B 35/589* | (2006.01) |
| *C04B 35/597* | (2006.01) |
| *C04B 35/622* | (2006.01) |
| *C04B 35/632* | (2006.01) |
| *G03F 7/004* | (2006.01) |
| *G03F 7/025* | (2006.01) |
| *G03F 7/027* | (2006.01) |
| *G03F 7/029* | (2006.01) |
| *G03F 7/031* | (2006.01) |

(Continued)

(52) U.S. Cl.
CPC .............. *C08G 77/50* (2013.01); *B28B 1/001* (2013.01); *B33Y 10/00* (2014.12); *C04B 35/515* (2013.01); *C04B 35/5603* (2013.01); *C04B 35/571* (2013.01); *C04B 35/58* (2013.01); *C04B 35/583* (2013.01); *C04B 35/589* (2013.01); *C04B 35/597* (2013.01); *C04B 35/622* (2013.01); *C04B 35/62218* (2013.01); *C04B 35/632* (2013.01); *C04B 35/64* (2013.01); *C08J 3/28* (2013.01); *G03F 7/0037* (2013.01); *G03F 7/0042* (2013.01); *G03F 7/0043* (2013.01); *G03F 7/025* (2013.01); *G03F 7/027* (2013.01); *G03F 7/029* (2013.01); *G03F 7/031* (2013.01); *G03F 7/038* (2013.01); *G03F 7/0755* (2013.01); *B33Y 70/00* (2014.12); *B33Y 80/00* (2014.12); *C04B 2235/48* (2013.01); *C04B 2235/483* (2013.01); *C04B 2235/486* (2013.01); *C04B 2235/6026* (2013.01); *C04B 2235/726* (2013.01); *C04B 2235/77* (2013.01); *C04B 2235/94* (2013.01); *C08J 2383/14* (2013.01)

(58) Field of Classification Search
CPC ....... C08G 77/50; G03F 7/025; G03F 7/0042; G03F 7/031; G03F 7/029; G03F 7/27; G03F 7/0043; G03F 7/0037; G03F 7/038; G03F 7/0755; C08J 3/28; C08J 2383/14; B33Y 10/00; B33Y 70/00; B33Y 80/00; C04B 35/622; C04B 35/586; C04B 35/5603; C04B 35/62218; C04B 35/515; C04B 35/58; C04B 35/632; C04B 35/597; C04B 35/583; C04B 35/64; C04B 35/571; C04B 2235/483; C04B 2235/726; C04B 2235/94; C04B 2235/486; C04B 2235/48; C04B 2235/6026; C04B 2235/77
USPC ........... 522/43, 33, 6, 71, 189, 184, 1; 520/1
See application file for complete search history.

(56) References Cited

U.S. PATENT DOCUMENTS 3,695,877 A 10/1972 Taneda et al.
3,790,378 A 2/1974 Hayakawa et al.
(Continued)

OTHER PUBLICATIONS

Eckel et al. "Additive manufacturing of polymer-derived ceramics" Science, Jan. 1, 2016, vol. 351, Issue 6268 with Supplemental Materials dated Jan. 1, 2016.
(Continued)

*Primary Examiner* — Jessica Whiteley
(74) *Attorney, Agent, or Firm* — O'Connor & Company

(57) ABSTRACT

This disclosure enables direct 3D printing of preceramic polymers, which can be converted to fully dense ceramics. Some variations provide a preceramic resin formulation comprising a molecule with two or more C=X double bonds or C≡X triple bonds, wherein X is selected from C, S, N, or O, and wherein the molecule further comprises at least one non-carbon atom selected from Si, B, Al, Ti, Zn, P, Ge, S, N, or O; a photoinitiator; a free-radical inhibitor; and a 3D-printing resolution agent. The disclosed preceramic resin formulations can be 3D-printed using stereolithography into objects with complex shape. The polymeric objects may be directly converted to fully dense ceramics with properties that approach the theoretical maximum strength of the base materials. Low-cost structures are obtained that are lightweight, strong, and stiff, but stable in the presence of a high-temperature oxidizing environment.

30 Claims, 3 Drawing Sheets

(51) Int. Cl.
  *G03F 7/038* (2006.01)
  *G03F 7/075* (2006.01)
  *B33Y 10/00* (2015.01)
  *B28B 1/00* (2006.01)
  *C04B 35/515* (2006.01)
  *C04B 35/64* (2006.01)
  *C08J 3/28* (2006.01)
  *G03F 7/00* (2006.01)
  *B33Y 70/00* (2020.01)
  *B33Y 80/00* (2015.01)

(56) References Cited

U.S. PATENT DOCUMENTS

| | | | | |
|---|---|---|---|---|
| 8,906,593 B1 * | 12/2014 | Nowak | ............... | G03F 7/027 430/270.1 |
| 9,075,312 B1 | 7/2015 | Nowak et al. | | |
| 2002/0035026 A1 | 3/2002 | Greil et al. | | |
| 2006/0069176 A1 * | 3/2006 | Bowman | ............... | C04B 35/584 522/1 |
| 2006/0165903 A1 | 7/2006 | Mazzanti | | |
| 2008/0194721 A1 * | 8/2008 | Arney | ............... | B82Y 10/00 522/49 |
| 2010/0269721 A1 | 10/2010 | Takahashi et al. | | |
| 2012/0010066 A1 | 1/2012 | Fischer et al. | | |
| 2013/0137065 A1 | 5/2013 | Velamakanni et al. | | |
| 2013/0216785 A1 * | 8/2013 | Sobek | ............... | C09D 133/06 428/147 |
| 2015/0301281 A1 | 10/2015 | Findley | | |
| 2017/0204227 A1 * | 7/2017 | Eckel | ............... | B33Y 10/00 |

OTHER PUBLICATIONS

Eckel et al. "Additive manufacturing of polymer-derived ceramics" Science, Jan. 1, 2016, vol. 351, Issue 6268.

* cited by examiner

RESIN FORMULATIONS FOR POLYMER-DERIVED CERAMIC MATERIALS

PRIORITY DATA

This patent application is a continuation application of U.S. patent application Ser. No. 15/406,762, filed on Jan. 15, 2017 (and allowed on Oct. 23, 2018), which claims priority to U.S. Provisional Patent App. No. 62/279,472, filed on Jan. 15, 2016, each of which is hereby incorporated by reference herein.

FIELD OF THE INVENTION

The present invention generally relates to formulations suitable for making preceramic polymers, which can be converted into ceramic structures.

BACKGROUND OF THE INVENTION

Additive manufacturing of ceramic materials is of interest for propulsion components, thermal protection systems, porous burners, microelectromechanical systems, and electronic device packaging, for example. Ceramic structures are typically sintered as compacted porous materials, severely decreasing the overall strength of the material. Thus, there exists a need for creating large, fully dense ceramic materials which possess the high strength of the parent material and are therefore useful for engineering applications.

Formulations have been described for creating ceramic materials, which can be printed (additively manufactured) with various methods such as stereolithography techniques and laser sintering. These are typically sintered powders or formulations with solid material suspended, typically producing porous structures. These methods are described in Zocca et al., "Additive Manufacturing of Ceramics: Issues, Potentialities, and Opportunities", *J. Am. Ceram. Soc.*, 98[7] 1983-2001 (2015).

In addition, formulations which can create 1D or 2D ceramics, or very small 3D structures, have been described. See U.S. Pat. No. 4,816,497 issued Mar. 28, 1989 to Lutz et al.; U.S. Pat. No. 5,698,485 issued Dec. 16, 1997 to Bruck et al.; U.S. Pat. No. 6,573,020 issued Jun. 3, 2003 to Hanemann et al.; U.S. Pat. No. 7,582,685 issued Sep. 1, 2009 to Arney et al.; and U.S. Patent App. Pub. No. US2006/0069176A1 published Mar. 30, 2006 to Bowman et al.

In comparison with metals and polymers, ceramics are difficult to process, particularly into complex shapes. Because they cannot be cast or machined easily, ceramics are typically consolidated from powders by sintering or deposited in thin films. Flaws, such as porosity and inhomogeneity introduced during processing, govern the strength because they initiate cracks, and—in contrast to metals—brittle ceramics have little ability to resist fracture. This processing challenge has limited the ability to take advantage of ceramics' impressive properties, including high-temperature capability, environmental resistance, and high strength. Recent advances in additive manufacturing have led to a multitude of different techniques, but all additive manufacturing techniques developed for ceramic materials are powder-based layer-by-layer processes. Only a few of the commercially available three-dimensional (3D) printing systems offer printing of ceramics, either by selective curing of a photosensitive resin that contains ceramic particles, selective deposition of a liquid binder agent onto ceramic particles (binder jetting), or selective fusion of a powder bed with a laser. All these techniques are limited by slow fabrication rates, and in many cases, a time-consuming binder removal process. By starting with powders, consolidation to a dense part is an almost insurmountable challenge, and residual porosity is typically unavoidable. Furthermore, many additive processes introduce large thermal gradients that tend to cause cracks in ceramics. Pores, cracks, and inhomogeneities are responsible for the low strength and poor reliability of additively manufactured ceramic parts.

Preceramic polymers are a class of polymers which allow, via a thermal treatment, a conversion of a polymer part to a ceramic material. Typically, these preceramic polymers contain silicon (Si) in the molecular backbone, with the resulting material containing Si. There are a wide variety of known preceramic polymers. Examples include polysilazanes, borasine-modified hydridopolysilazanes, polysilanes, polycarbosilanes, silicone resins, polyvinylborazine, polyborazylene, and decaborane-based polymers. These preceramic polymers have been used to form specific polymer-based structures that can be subsequently heat-treated (pyrolyzed or sintered) to create near net-shape ceramic structures.

A stereolithography technique provides a method to build a 3D polymer microstructure in a layer-by-layer process. This process usually involves a platform (e.g., substrate) that is lowered into a photomonomer bath in discrete steps. At each layer, a laser is used to scan over the area of the photomonomer that is to be cured (i.e., polymerized) for that particular layer. Once the layer is cured, the platform is lowered by a specific amount, determined by the processing parameters and desired feature/surface resolution, and the process is repeated until the complete 3D structure is created. One example of such a stereolithography technique is disclosed in U.S. Pat. No. 4,575,330 issued Mar. 11, 1986 to Hull et al.

Modifications to the above-described stereolithography technique have been developed to improve the polymer resolution by using laser optics and special resin formulations. Also, modifications have been made to decrease the fabrication time of the 3D polymer structure by using a dynamic pattern generator to cure an entire layer at once. One example of such a modification is disclosed in Bertsch et al., "Microstereolithography: A Review," *Materials Research Society Symposium Proceedings*, Vol. 758, 2003. Another advancement to the standard stereolithography technique includes a two-photon polymerization process, as disclosed in Sun et al., "Two-Photon Polymerization And 3D Lithographic Microfabrication," Advances in Polymer Science, Vol. 170, 169-273, 2004.

However, no prior art teaches the formation of fully dense, high-strength, polymer-derived ceramic parts through UV-cure-based 3D printing or stereolithography, from Si-containing or related resin formulations. Current state of the art relies either on the sintering of ceramic particles or using ceramic particles printed in a binder, both of which produce porous ceramics. Porous ceramic structures have significantly lower strength than the parent material.

Direct, free-form 3D printing of preceramic polymers, which can be converted to fully dense ceramics, is sought. What are needed are low-cost structures that are lightweight, strong, and stiff, but stable in the presence of a high-temperature oxidizing environment. The monomers and polymeric systems preferably maintain properties so that they can be printed using stereolithography into complex 3D shapes. Ideally, the polymeric systems may be directly converted to fully dense ceramics with properties that approach the theoretical maximum strength of the base materials.

SUMMARY OF THE INVENTION

The present invention addresses the aforementioned needs in the art, as will now be summarized and then further described in detail below.

Some variations provide a preceramic resin formulation comprising:
  (a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;
  (b) optionally a second molecule comprising R—Y—H, wherein R is an organic group or an inorganic group, and wherein Y is selected from the group consisting of S, N, O, and combinations thereof;
  (c) a photoinitiator and optionally a thermal free-radical initiator;
  (d) a free-radical inhibitor; and
  (e) a 3D-printing resolution agent.

In some embodiments, the first molecule is present from about 3 wt % to about 97 wt % of the formulation, for example.

In some embodiments, at least one of the double bonds (or triple bonds) is located at a terminal position of the first molecule.

The first molecule may include one or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof. In some embodiments, the first molecule includes two or more of such functional groups.

In some embodiments in which the second molecule is included in the preceramic resin formulation, the second molecule is present from about 0.1 wt % to about 97 wt % of the formulation, for example.

The second molecule may include one or more functional groups selected from the group consisting of thiol, alkyl, ester, amine, hydroxyl, and functional analogs thereof. Alternatively, or additionally, the second molecule may be chemically contained within one or more functional groups selected from the group consisting of thiol, alkyl, ester, amine, hydroxyl, and functional analogs thereof.

When the second molecule is present, the R may be, or include, an inorganic group containing an element selected from the group consisting of Si, B, Al, Ti, Zn, P, Ge, S, N, O, and combinations thereof. In some embodiments, at least 10% (such as at least 40%) of the R is inorganic. In certain embodiments, at least 10% (such as at least 40%) of the R is Si.

The photoinitiator, optionally in combination with a thermal free-radical initiator, may be present from about 0.001 wt % to about 10 wt % of the formulation, for example. In some embodiments, the photoinitiator and/or the thermal free-radical initiator is selected from the group consisting of 2,2-dimethoxy-2-phenylacetophenone, 2-hydroxy-2-methylpropiophenone, camphorquinone, bis(2,4,6-trimethylbenzoyl)-phenylphosphineoxide, benzophenone, benzoyl peroxide, dicumyl peroxide, 2,2'-azobisisobutyronitrile, and combinations or derivatives thereof.

Optionally the formulation further includes a radiation-trigger free-radical initiator that is active at a wavelength substantially different from the photoinitiator. When the preceramic resin formulation includes a thermal free-radical initiator, optionally the formulation further includes a radiation-trigger free-radical initiator that is active at a wavelength substantially different from the photoinitiator.

The free-radical inhibitor may be present from about 0.001 wt % to about 10 wt % of the formulation, for example. The free-radical inhibitor may be selected from the group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations or derivatives thereof.

The 3D-printing resolution agent may be present from about 0.001 wt % to about 10 wt % of the formulation, for example. The 3D-printing resolution agent may be selected from UV absorbers, fluorescent molecules, optical brighteners, or combinations thereof. In some embodiments, the 3D-printing resolution agent is selected from the group consisting of 2-(2-hydroxyphenyl)-benzotriazole, 2-hydroxyphenyl-benzophenones, 2-hydroxyphenyl-s-triazines, 2,2'-(2,5-thiophenediyl)bis(5-tert-butylbenzoxazole), 2,2'-(1,2-ethenediyl)bis(4,1-phenylene)bisbenzoxazole, and combinations or derivatives thereof.

Other variations of the invention provide a ceramic structure produced by polymerization, 3D printing, and thermal treatment (e.g., pyrolysis or sintering) of a preceramic resin formulation comprising:
  (a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;
  (b) optionally a second molecule comprising R—Y—H, wherein R is an organic group or an inorganic group, and wherein Y is selected from the group consisting of S, N, O, and combinations thereof;
  (c) a photoinitiator and optionally a thermal free-radical initiator;
  (d) a free-radical inhibitor; and
  (e) a 3D-printing resolution agent.

In certain embodiments, the ceramic structure contains from about 0.01 wt % to about 20 wt % sulfur, such as from about 0.1 wt % to about 10 wt % sulfur.

The ceramic structure may be characterized by at least 50% theoretical density, preferably at least 75% theoretical density, and more preferably at least 95% theoretical density. In preferred embodiments, without limitation, the ceramic structure is a fully dense monolith, i.e. 99% or greater theoretical density.

The present invention also provides a method of making a ceramic structure, the method comprising
  (i) obtaining a preceramic resin formulation;
  (ii) polymerizing and 3D-printing (preferably simultaneously) at least a portion of the preceramic resin formulation to generate a preceramic polymer; and
  (iii) thermally treating at least a portion of the preceramic polymer to produce a ceramic structure,
  wherein the preceramic resin formulation preferably comprises:
  (a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;

(b) optionally a second molecule comprising R—Y—H, wherein R is an organic group or an inorganic group, and wherein Y is selected from the group consisting of S, N, O, and combinations thereof;

(c) a photoinitiator and optionally a thermal free-radical initiator;

(d) a free-radical inhibitor; and (e) a 3D-printing resolution agent.

In certain method embodiments, the ceramic structure contains from about 0.01 wt % to about 20 wt % sulfur, such as from about 0.1 wt % to about 10 wt % sulfur.

The produced ceramic structure may be characterized by at least 50% theoretical density, preferably at least 75% theoretical density, and more preferably at least 95% theoretical density. In preferred embodiments, without limitation, the ceramic structure is a fully dense monolith.

DETAILED DESCRIPTION OF EMBODIMENTS OF THE INVENTION

Figure 1:
FIG. 1 shows a top-view photograph of a preceramic polymer part, in Example 1.

The compositions (also referred to as formulations), structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Variations of this invention provide resin formulations which may be used for 3D printing (e.g., by stereolithography) of an intermediate structure followed by thermally treating (e.g., by firing or pyrolyzing) to convert the 3D intermediate structure part into a 3D ceramic structure. The ceramic materials may be prepared from one or more disclosed preceramic resin formulations that can be used in UV-cure-based 3D printing (stereolithography), for example, to form polymer parts which enable direct thermal conversion to ceramics. "Preceramic" in this disclosure simply refers to the capability to be ultimately converted to a ceramic material. It is noted that the disclosed preceramic resin formulations are precursors to preceramic polymers, which themselves are precursors to ceramic materials.

Variations of the invention enable direct, free-form 3D printing of preceramic polymers which can be converted to dense ceramics, or even fully dense ceramics. The preceramic resin formulations are preferably compatible with stereolithography photopolymerization. The monomers and polymeric systems can be printed into potentially complex 3D shapes. Preferred preceramic resin formulations allow the ceramic structures to be formed with high thermal stability and mechanical strength. The disclosed resin formulations can be economically converted into structures that are lightweight, strong, and stiff—but can withstand a high-temperature oxidizing environment. Final interconnected three-dimensional ceramic materials include, but are not limited to, silicon oxycarbide (SiOC), silicon carbide (SiC), silicon nitride ($Si_3N_4$), silicon oxynitride (SiON), silicon carbonitride (SiCN), silicon boronitride (SiBN), silicon boron carbonitride (SiBCN), and boron nitride (BN).

The 3D ceramic material is prepared directly from 3D printed preceramic polymer material, which is prepared from preceramic resin formulations. The 3D printing (resin conversion to preceramic polymer) may be accomplished though UV-cure methods via stereolithography with laser rastering, DLP (digital light processing), and/or LCDP (liquid crystal device projector) projection, for example.

The extremely high melting point of many ceramics adds challenges to additive manufacturing to make a 3D part, as compared with metals and polymers. Ceramics cannot be cast or machined easily. By contrast, the methods disclosed herein enable geometrical flexibility. As disclosed herein, preceramic resins that are cured with ultraviolet light in a stereolithography 3D printer or through a patterned mask, for example, form 1D, 2D, or 3D polymer structures that can have complex shape and cellular architecture. These polymer structures can then be thermally converted to the corresponding 1D, 2D, or 3D ceramic part, in some embodiments with uniform shrinkage and virtually no porosity.

Some variations provide a preceramic resin formulation comprising:
  (a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;
  (b) optionally a second molecule comprising R—Y—H, wherein R is an organic group or an inorganic group, and wherein Y is selected from the group consisting of S, N, O, and combinations thereof (Y is not yttrium in this specification);
  (c) a photoinitiator and optionally a thermal free-radical initiator;
  (d) a free-radical inhibitor; and
  (e) a 3D-printing resolution agent.

As intended herein, a "resin" means a composition capable of being polymerized or cured, further polymerized or cured, or crosslinked. Resins may include monomers, oligomers, prepolymers, or mixtures thereof.

In some embodiments, the first molecule is present from about 3 wt % to about 97 wt % of the formulation, such as about 4, 5, 10, 15, 20, 25, 30, 35, 40, 45, 50, 55, 60, 65, 70, 75, 80, 85, 90, or 95 wt %, for example.

In some embodiments, the first molecule contains two or more C=X double bonds, and at least one of these double bonds is located at a terminal position of the first molecule. In some embodiments, the first molecule contains two or more C≡X triple bonds, and at least one of these triple bonds is located at a terminal position of the first molecule. In some embodiments, the first molecule contains at least one C=X double bond and at least one C≡X triple bond, and the C=X double bond is located at a terminal position, or the C≡X triple bond is located at a terminal position, or both of the C=X double bond and the C≡X triple bond are located at (different) terminal positions within the first molecule. Note that a molecule may contain more than two terminal positions, when there is branching present.

In the first molecule, the non-carbon atom may be present in the main chain, in side chains, or in both of these.

The first molecule may include one or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof. In some embodiments, the first molecule includes two or more of such functional groups.

A "functional analog" herein means that the functional group has similar chemical and reactive properties, with respect to the polymerization of the preceramic resin formulation.

In some embodiments in which the second molecule is included in the preceramic resin formulation, the second molecule is present from about 0.1 wt % to about 97 wt % of the formulation, such as about 0.2, 0.5, 1, 2, 3, 4, 5, 10, 15, 20, 25, 30, 35, 40, 45, 50, 55, 60, 65, 70, 75, 80, 85, 90, or 95 wt %, for example.

The second molecule may include one or more functional groups selected from the group consisting of thiol, alkyl, ester, amine, hydroxyl, and functional analogs thereof. Alternatively, or additionally, the second molecule may be chemically contained within one or more functional groups selected from the group consisting of thiol, alkyl, ester, amine, hydroxyl, and functional analogs thereof.

When the second molecule is present, the R group may be, or include, an inorganic group containing an element selected from the group consisting of Si, B, Al, Ti, Zn, P, Ge, S, N, O, and combinations thereof.

In some embodiments, at least 5%, 10%, 15%, 20%, 25%, 30%, 35%, 40%, 45%, or 50% (mole percent) of the R group is inorganic, i.e. not carbon. In certain embodiments, at least 5%, 10%, 15%, 20%, 25%, 30%, 35%, 40%, 45%, or 50% (mole percent) of the R group is specifically Si.

In the second molecule, the R group may be present in the main chain, in side chains, or in both of these. The non-carbon atom of the R group, when it is inorganic, may be the same as or different than the non-carbon atom in the first molecule.

The weight ratio of second molecule to first molecule may vary from about 0 to about 32, such as about 0.5, 1, 2, 3, 5, 10, 15, 20, 25, or 30. In some embodiments, the weight ratio of second molecule to first molecule is dependent on the ratio of thiol to vinyl. For example, in certain embodiments there is at least one thiol functional group available per vinyl group.

The photoinitiator, optionally in combination with a thermal free-radical initiator, may be present from about 0.001 wt % to about 15 wt % of the formulation, for example. In various embodiments, the photoinitiator may be present at about 0.002, 0.005, 0.01, 0.05, 0.1, 0.2, 0.3, 0.4, 0.5, 1, 2, 3, 4, 5, 6, 7, 8, 9, or 10 wt % of the formulation, for example. In various embodiments in which a thermal free-radical initiator is present, the thermal free-radical initiator may be present at about 0.002, 0.005, 0.01, 0.05, 0.1, 0.2, 0.3, 0.4, 0.5, 1, 2, 3, 4, 5, 6, 7, 8, 9, or 10 wt % of the formulation, for example. In certain embodiments in which both a photoinitiator and thermal free-radical initiator are present, they may each be present at about 0.001, 0.002, 0.005, 0.01, 0.05, 0.1, 0.2, 0.3, 0.4, 0.5, 1, 2, 3, 4, or 5 wt % of the formulation, for example.

In some embodiments, the photoinitiator and/or the thermal free-radical initiator is selected from the group consisting of 2,2-dimethoxy-2-phenylacetophenone, 2-hydroxy-2-methylpropiophenone, camphorquinone, bis(2,4,6-trimethylbenzoyl)-phenylphosphineoxide, benzophenone, benzoyl peroxide, dicumyl peroxide, 2,2'-azobisisobutyronitrile, camphorquinone, oxygen, nitrogen dioxide, and combinations or derivatives thereof. Other photoinitiators or thermal free-radical initiators may be utilized.

A thermal free-radical initiator may be useful, for example, to crosslink unreacted vinyl groups remaining which have not reacted with the thiol group. A thermal free-radical initiator may also be useful to react vinyl group(s) with other available functional groups such as, but not limited to, methyl or hydro groups in the first or second molecule, thereby creating a second type of reaction mechanism.

Optionally the formulation further includes a radiation-trigger free-radical initiator that is active at a wavelength substantially different from the photoinitiator. When the preceramic resin formulation includes a thermal free-radical initiator, optionally the formulation further includes a radiation-trigger free-radical initiator.

The free-radical inhibitor may be present from about 0.001 wt % to about 10 wt % of the formulation, for example. In various embodiments, the free-radical inhibitor may be present at about 0.002, 0.005, 0.01, 0.05, 0.1, 0.2, 0.3, 0.4, 0.5, 1, 2, 3, 4, 5, 6, 7, 8, 9, or 10 wt % of the formulation, for example.

The free-radical inhibitor may be selected from the group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations or derivatives thereof.

A "3D-printing resolution agent" is a compound that improves print quality and resolution by containing the curing to a desired region of the laser or light exposure. The 3D-printing resolution agent may be present from about 0.001 wt % to about 10 wt % of the formulation, for example. In various embodiments, the 3D-printing resolution agent may be present at about 0.002, 0.005, 0.01, 0.05, 0.1, 0.2, 0.3, 0.4, 0.5, 1, 2, 3, 4, 5, 6, 7, 8, 9, or 10 wt % of the formulation, for example.

The 3D-printing resolution agent may be selected from UV absorbers, fluorescent molecules, optical brighteners, or combinations thereof. In some embodiments, the 3D-printing resolution agent is selected from the group consisting of 2-(2-hydroxyphenyl)-benzotriazole, 2-hydroxyphenyl-benzophenones, 2-hydroxyphenyl-s-triazines, 2,2'-(2,5-thiophenediyl)bis(5-tert-butylbenzoxazole), ethenediyl)bis(4,1-phenylene)bisbenzoxazole, and combinations or derivatives thereof.

In the above or other variations, a preceramic resin formulation is provided, comprising the following components.

1. A first molecule comprises two or more unsaturated C=X double bonds or C≡X triple bonds. X can be C, S, O, or N, so these functional groups can be C=C double bond, C≡C triple bond, C=S, C=O, or C≡N triple bond. In some embodiments, X is selected from the group consisting of C and S. Substitution on the unsaturated bonds can be with any atoms such as H, F or Cl, or groups such as alkyl groups, esters, amine groups, hydroxyl groups, or CN. The first molecule can contain different combinations of these different unsaturated bonds. Of these different unsaturated bonds, the most common ones are C=C double bonds at the terminal position of the molecules (i.e., three substitutions on the C=C bonds are hydrogen atoms). Examples of these groups include vinyl, ethynyl, vinyl ether, vinyl ester, vinyl amides, vinyl triazine, vinyl isocyanurate, acrylate, methacrylate, diene, triene, or mixtures thereof.

The first molecule also contains at least one non-carbon atom in the main chain or in side chains. Examples of non-carbon atoms that can be used include, but are not limited to, Si, B, Al, Ti, Zn, O, N, P, S, or Ge. In some embodiments, when X is O, the non-carbon atom is not O; or when X is N, the non-carbon atom is not N. The non-carbon atoms can be a part of cyclic or acyclic groups or structures.

Examples of the first component molecules include, but are not limited to, trivinylborazine; 2,4,6-trimethyl-2,4,6-trivinylcyclotrisilazane; 1,3,5,7-tetravinyl-1,3,5,7-tetramethylcyclotetrasilazane; 1,3,5-trivinyl-1,3,5-trimethylcyclosiloxane; 1,3,5,7-tetravinyl-1,3,5,7-tetramethylcyclotetrasiloxane; 2,2,4,4,6,6-hexakisallyloxyl-triazatriphosphinine; tetraallyloxysilane; vinyl-terminated polydimethylsiloxane; tetravinylsilane; vinyl-terminated polydimethylsiloxane-ethylene copolymer; divinyldimethylsilane; 1,2-divinyltetramethyldisilane; 1,4-bis(vinyldimethylsilyl)benzene; vinylmethylsiloxane homopolymer; methacryloxypropyl terminated polydimethylsiloxane; boron vinyldimethylsiloxide; vinylmethylsiloxane-dimethylsiloxane copolymer, trimethylsiloxy terminated polymer; vinylethoxysiloxane-propylethoxysiloxane copolymer; vinyltrimethoxysilane; trivinylmethylsilane; diallyldimethylsilane; 1,3,5-trisilacyclohexane; B,B'B"-trithynyl-N,N'N"-trimethylborazine; and B,B'B"-triethynylborazine.

The first molecule may be between 3% to about 97% by weight of the resin formulation.

2. A second molecule, which may or may not be present, has a structure R—Y—H, wherein Y=O, S, N. The molecules R—Y—H can contain two or more YH groups in the structure that can be used in the polymerization. In certain embodiments, the second molecule comprises two or more SH groups, i.e. thiol or mercapto groups. The R groups can be organic groups such as alkyl groups, esters, amines, or hydroxyl, or inorganic non-carbon-containing atoms or groups, which may be part of cyclic or acyclic structures. Examples of inorganic non-carbon atoms or groups in the main chain or side chains include, but are not limited to, Si, B, Al, Ti, Zn, P, Ge, S, O, N, or combinations thereof. In some embodiments, when Y is O, the R group is not O; or when Y is N, the R group is not N.

Examples of the second component includes, but not limited to, pentaerythritol tetrakis(3-mercaptopropionate); trimethylolpropanetris(2-mercaptoacetate); trimethylolpropane tris(3-mercaptopropionate); tetrakis(dimethyl-3-mercaptopropylsiloxy)silane; tetrakis(dimethyl-2-mercaptoacetate siloxy)silane; (mercaptopropyl)methylsiloxane]-dimethylsiloxane copolymer; mercaptopropyl)methylsiloxane homopolymer; and pentaerythritol tetrakis (2-mercaptoacetate).

The second molecule is generally between 0% and about 97% by weight of the resin formulation. The ratio of second molecule to first molecule may vary widely, from 0 to 10, 20, 30 or more. This ratio will influence the polymerization reaction rate as well as the polymer composition. The use of a thiol with at least half of the main chain made of inorganic atom, such as silicon, is preferred. Oxygen, nitrogen, and/or carbon may also be present.

3. A photoinitiator generates free radicals under light exposure from light having a wavelength from about 200 nm to about 500 nm, for example. The photoinitiator is more than 0% to about 10% or less total weight of the resin formulation. One or a combination of different types of photoinitiators can be used in the polymerization process and usually result in different reaction rates. Examples of photoinitiators include, but are not limited to, 2,2-dimethoxy-2-phenylacetophenone; 2-hydroxy-2-methylpropiophenone; camphorquinone; bis(2,4,6-trimethylbenzoyl)-phenylphosphineoxide; benzophenone; and benzoyl peroxide.

4. Optionally a free-radical thermal initiator is included, which generates free radicals under elevated temperature conditions. When present, the free-radical thermal initiator is present up to about 10% or less total weight of the resin formulation. One or a combination of different types of thermal initiators may be used in the polymerization process and usually result in different reaction rates. The addition of thermal initiator allows for multiple mechanisms of curing in the formulation, initiated or propagated by both UV and thermal energy. Examples of thermal initiators include, but are not limited to, benzoyl peroxide, dicumyl peroxide, and 2,2'-azobisisobutyronitrile.

5. A free-radical inhibitor is added in a sufficient amount to the resin formulation to inhibit unwanted polymerization of regions outside the desired printing area so as to allow sufficient resolution to the desired part. In some embodiments, the free-radical inhibitor inhibits unwanted polymerization of regions outside an optical waveguide so as to allow formation of preceramic-polymer waveguides. Examples of free-radical inhibitors include, but are not limited to, hydroquinone; methylhydroquinone; ethylhydroquinone; methoxyhydroquinone; ethoxyhydroquinone; monomethylether hydroquinone; propylhydroquinone; propoxyhydroquinone; tert-butylhydroquinone; and n-butylhydroquinone. The free-radical inhibitor is typically selected to be from about 0.001% to about 1% by weight of the total resin formulation.

6. UV absorbers, fluorescents, or optical brighteners are preferably included to absorb light at the desired wavelength and convert the energy either into thermal energy or radiation at a higher wavelength. These 3D-printing resolution agents improve print quality and resolution by containing the curing to the region of the laser or light exposure to the desired region laterally and vertically in the print bath. Examples of UV absorbers include, but are not limited to, 2-(2-hydroxyphenyl)-benzotriazole, 2-hydroxyphenyl-benzophenones, 2-hydroxyphenyl-s-triazines, 2,2'-(2,5-thiophenediyl)bis(5-tert-butylbenzoxazole), and 2,2'-(1,2-ethenediyl)bis(4,1-phenylene)bisbenzoxazole.

Other variations of the invention provide a ceramic structure produced by polymerization, 3D printing, and thermal treatment (e.g., pyrolysis or sintering) of a preceramic resin formulation comprising:
(a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;
(b) optionally a second molecule comprising R—Y—H, wherein R is an organic group or an inorganic group, and wherein Y is selected from the group consisting of S, N, O, and combinations thereof;
(c) a photoinitiator and optionally a thermal free-radical initiator;
(d) a free-radical inhibitor; and
(e) a 3D-printing resolution agent.

In certain embodiments, the ceramic structure contains from about 0.01 wt % to about 20 wt % sulfur, such as from about 0.1 wt % to about 10 wt % sulfur. In various embodiments, the ceramic structure contains about 0.1, 0.2, 0.5, 1, 2, 3, 4, 5, 6, 7, 8, 9, 10, 11, 12, 13, 14, or 15 wt % sulfur.

The ceramic structure may be characterized by at least 50% theoretical density, preferably at least 75% theoretical density, and more preferably at least 95% theoretical density. By "theoretical density" it is meant the actual density of the ceramic structure as a percentage of theoretical density of the material itself, calculated in the absence of porous voids. For example a ceramic structure with absolute density of 2.0 g/cm$^3$, fabricated from a base material with inherent (bulk) density of 2.1 g/cm$^3$, exhibits a theoretical density of 2.0/2.1=95%.

In various embodiments, the ceramic structure is characterized by a theoretical density of about (or at least about) 60, 65, 70, 75, 80, 85, 90, 91, 92, 93, 94, 95, 96, 97, 98, 99, or 99.5%. In preferred embodiments, without limitation, the ceramic structure is a fully dense monolith, which means that the ceramic structure has at least 99% (e.g., essentially 100%) theoretical density associated with a part or continuous region of material (a "monolith"). The absolute density in g/cm$^3$ will vary, depending on the selection of base materials; an exemplary range is about 1 g/cm$^3$ to 3 g/cm$^3$.

The present invention also provides a method of making a ceramic structure, the method comprising
(i) obtaining a preceramic resin formulation;
(ii) polymerizing and 3D-printing (preferably simultaneously) at least a portion of the preceramic resin formulation to generate a preceramic polymer; and
(iii) thermally treating at least a portion of the preceramic polymer to produce a ceramic structure,
wherein the preceramic resin formulation preferably comprises:
(a) a first molecule comprising two or more C=X double bonds, two or more C≡X triple bonds, or at least one C=X double bond and at least one C≡X triple bond, wherein X is selected from the group consisting of C, S, N, O, and combinations thereof, and wherein the first molecule further comprises at least one non-carbon atom selected from the group consisting of Si, B, Al, Ti, Zn, P, Ge, S, N, O, and combinations thereof;
(b) optionally a second molecule comprising R—Y—H, wherein R is an organic group or an inorganic group, and wherein Y is selected from the group consisting of S, N, O, and combinations thereof;
(c) a photoinitiator and optionally a thermal free-radical initiator;
(d) a free-radical inhibitor; and
(e) a 3D-printing resolution agent.

In certain method embodiments, the ceramic structure contains from about 0.01 wt % to about 20 wt % sulfur, such as from about 0.1 wt % to about 10 wt % sulfur. In various methods, the final ceramic structure contains about 0.1, 0.2, 0.5, 1, 2, 3, 4, 5, 6, 7, 8, 9, 10, 11, 12, 13, 14, or 15 wt % sulfur.

The produced ceramic structure may be characterized by at least 50% theoretical density, preferably at least 75% theoretical density, and more preferably at least 95% theoretical density. In various embodiments, the ceramic structure is characterized by a theoretical density of about (or at least about) 60, 65, 70, 75, 80, 85, 90, 91, 92, 93, 94, 95, 96, 97, 98, 99, or 99.5%. In preferred embodiments, without limitation, the ceramic structure is a fully dense monolith.

A method of making a ceramic structure may include first polymerizing a preceramic resin formulation, followed by 3D printing of the already-made polymer. Preferably, the polymerizing and 3D printing steps are performed simultaneously, at a desired location (e.g., a layer) within a part. In some embodiments, the polymerizing and 3D printing steps are performed semi-simultaneously, in which multiple steps are performed overall while at each step, some amount of polymerizing and some amount of 3D printing takes place.

In typical embodiments, the curing or conversion of preceramic resin formulation to preceramic polymer includes crosslinking. A crosslink is a bond that links one polymer chain to another. Crosslink bonds can be covalent bonds or ionic bonds. When polymer chains are linked together by crosslinks, they lose some of their ability to move as individual polymer chains. Crosslinks are the characteristic property of thermosetting plastic materials. In most cases, crosslinking is irreversible.

In some embodiments, while a monomer is being converted to polymer, a gel is formed first, followed by a solid material as the monomer conversion is further increased to crosslink chains together. A "gel" is a solid, jelly-like material that can have properties ranging from soft and weak to hard and tough. Gels exhibit no flow when in the steady-state. By weight, gels are mostly liquid, yet they behave like solids due to a three-dimensional crosslinked network within the liquid.

Some variations of the invention utilize a self-propagating polymer waveguide, as described in commonly owned U.S. Pat. No. 7,687,132 issued Mar. 30, 2010 to Gross et al.; U.S. Pat. No. 9,341,775 issued May 17, 2016 to Eckel et al.; U.S. Pat. No. 9,377,567 issued Jun. 28, 2016 to Jacobsen et al.; and U.S. Pat. No. 9,528,776 issued Dec. 27, 2016 to Roper et al., which are hereby incorporated by reference herein. Without being limited by speculation or theory, it is hypothesized that initial exposure of monomer to a collimated beam can initiate microgel sites within the liquid monomer layer. These microgel sites have a higher crosslink density than the surrounding monomer/polymer, which leads to a higher localized refractive index. The higher refractive index at the microgel site may act as a lens. The focused energy from the incident beam leads to initial "waveguide" formation in the direction of the incident (primary) beam, where the refractive index of the waveguide is higher than the surrounding monomer/polymer. U.S. Pat. No. 7,382,959 issued Jun. 3, 2008 to Jacobsen is hereby incorporated by reference herein for its description of mechanisms involving self-propagating polymer waveguide formation.

In some embodiments, sufficient polymerization inhibitor and UV absorber are added to the resin formulation to confine the polymerization to the laser exposure point and to minimize scatter to maintain fidelity in the features of the printed part. UV light is then scanned across the resin surface to expose a cross section and build up a thin slice of the part to be manufactured. Although in principle any geometry can be fabricated with this approach, the process is slow, because every thin layer has to be exposed separately.

Structures with linear features extending from the exposure surface, such as lattices and honeycombs, can be formed much more rapidly when utilizing the self-propagating photopolymer waveguide technology. Monomers are selected to promote a change in the index of refraction upon polymerization, which causes internal reflection of the UV light, trapping it in the already-formed polymer. This exploits a self-focusing effect that forms a polymer waveguide, tunneling the light toward the tip of the waveguide and causing it to polymerize further. This reduces the need for additives that control scatter and UV absorption. The architecture of the material or structure can then be defined by a patterned mask that defines the areas exposed to a collimated UV light source, for example. The polymer crosslink density depends on exposure parameters and can be increased by thermal treatments or additional UV exposure. Unpolymerized resin may be recycled and reused.

In some embodiments, the photoinitiator generates free radicals under light exposure by one of intramolecular bond cleavage or intermolecular hydrogen abstraction. Typically, the monomer will polymerize when exposed to UV light (wavelengths of 10 nm to 400 nm), although photoinitiators may be used to initiate polymerization when exposed to other wavelengths, such as in the visible spectrum. In certain embodiments, light exposure is produced from light having one or more wavelengths selected from about 200 nm to about 700 nm, such as about 250, 300, 350, 400, 500, or 600 nm.

Optionally, a thermal post-cure of the 3D polymer is performed, after the 3D printing but prior to the pyrolysis to produce the ceramic structure. For example, the 3D polymer may be heated to a temperature of about 60° C. to about 500° C., such as about 250° C. to about 400° C., for a thermal post-cure time of about 10 minutes to about 8 hours, such as about 20 minutes to about 2 hours. Optionally, a thermal initiator is present.

After polymerization, a thermal treatment is then conducted. The direct conversion of a preceramic 3D-printed structure to a ceramic structure may be achieved by pyrolysis, sintering, annealing, calcination, or another thermal treatment technique. The thermal treatment is preferably performed following polymerization and any (optional) thermal post-cure of the 3D polymer. In certain embodiments, the thermal treatment is combined (i.e., overlaps in time and/or temperature) with polymerization, thermal post-cure, or both. It will also be recognized that even when a sequential operation is intended, some amount of ceramic formation may occur prior to a planned step of thermal treatment, as a result of the intrinsic kinetics and thermodynamics of the reaction system.

Typically, the thermal treatment is based on heating the 3D-printed structure for an extended period of time (such as from 10 minutes to 1 week) under various inert or reactive atmospheres, such as $N_2$, Ar, air, $CH_4$, $C_2H_6$, $C_2H_4$, CO, $CO_2$, or a combination of these gases. The thermal treatment may include heating at a rate of 0.1° C./min to 20° C./min from ambient temperature (e.g. about 25° C.) to 1000° C., dwelling at 1000° C. for at least 15 minutes, and then cooling at a rate of −0.1° C./min to −20° C./min back to ambient temperature. The dwell temperature may vary; for example, dwell temperatures of about 500° C. to about 1500° C. may be employed.

In some embodiments, a reactive thermal treatment is performed, in which the gas is reactive toward the initial polymer, the final ceramic material, or both of these. When the gas is reactive, it may react with a component and cause it to leave the material. Alternatively, or additionally, the gas may react with a component and remain with the base material. It is also possible for the gas to react and form products, some of which depart from the material while the rest remains with the material. Reactive gases may be selected from $O_2$, $O_3$, air, CO, $CO_2$, $H_2$, $H_2O$, $CH_4$, $SO_2$, $H_2S$, $NH_3$, NO, $NO_2$, and $N_2O$, and so on. The maximum temperature for reactive thermal treatment may be, for example, about 300° C. to about 1500° C. The system pressure may also be adjusted to influence the gas atmosphere.

Also, liquid or solid additives may be introduced into the preceramic resin formulation, the preceramic polymer, or both of these, to enhance the conversion to a ceramic structure. For example, additives to seed crystallization or phase formation (in the final ceramic material) may be introduced. The additives may include nanoparticles, such as nanoparticle metal oxides, for example.

During the thermal treatment, whether an inert or reactive thermal treatment technique is employed, gases escape. Gases are formed during the conversion of preceramic polymer to the ceramic structure, by decomposition reactions of the polymer, photoinitiator, free-radical inhibitor, and/or 3D-printing resolution agent. The escaping gases or vapors may include (but are by no means limited to) $CH_4$, $H_2$, CO, $CO_2$, $H_2O$, $SO_2$, etc.

The overall mass loss associated with the conversion of preceramic polymer to the ceramic structure may vary widely, such as from about 1 wt % to about 90 wt %, e.g. about 5, 10, 20, 30, 40, 50, 60, 70, or 80 wt %. The overall mass loss will be dictated by the starting formulation (e.g., fraction organic versus inorganic) as well as by process parameters. In principle, the lost mass may be recovered separately and used for other purposes.

Associated with mass loss may be shrinkage of the preceramic polymer as it converts to the ceramic structure. The linear shrinkage (calculated in a single dimension, such as height of part) may be from 0% to about 60%, for example. Note that the mass loss and shrinkage are not necessarily correlated. In some embodiments with high mass loss, there is not much (if any) shrinkage. These embodiments tend to produce higher porosity and therefore lower densities. In some embodiments with high mass loss, there is substantial shrinkage. These embodiments tend to produce lower porosity, or no porosity, and therefore higher densities (e.g., fully dense ceramic materials). Finally, in some embodiments, there is little mass loss but shrinkage associated with chemical reactions taking place. These embodiments also tend to produce relatively high densities.

Despite shrinkage, the bulk shape (relative geometry) of the preceramic 3D-printed polymer may be preserved in the final ceramic structure. That is, when shrinkage is uniform in all dimensions, the geometrical features are retained in the part: it is a scaled-down version, in all three dimensions. In some embodiments, shrinkage is approximately uniform, which means the geometrical features are basically maintained, with slight deviations. Uniform shrinkage is possible when there is no random fragmentation during conversion of the preceramic polymer to the ceramic structure, and when the reactions and gas escape are isotropic within the material. Note that very small features, such as at the nanoscale, may not be preserved during otherwise uniform shrinkage.

Practically speaking, uniform shrinkage (or no shrinkage) enables the formation of parts that are "net shape" or "near net shape." "Net shape" means that the geometrical features are retained, so that manufactured parts allow final fabrication matching the intended design with little or no post-processing. "Near net shape" means that the geometrical features are not perfectly retained but require only minimal post-processing or hand-work. Both net-shape parts and near-net-shape parts require little or no machining, polishing, bonding, surface finishing, or assembly.

The configuration and microstructure of the preceramic polymer determine the composition, microstructure, and yield of the ceramic material after thermal treatment. A high crosslink density is preferred to prevent the fragmentation and loss of low-molecular-mass species, which have not fully converted to either ceramic or escaping gases, during thermal treatment.

Depending on the preceramic resin formulation, the thermal treatment may produce ceramic structures which include, but are certainly not limited to, SiC, SiOC, $Si_3N_4$, SiON, SiCN, SiBN, SiBCN, or BN. When carbon is desired in the ceramic material, the fraction of carbon may be tailored, for example, by adding phenyl groups on the side chain of the polymer or by using a carbon-based crosslinking agent such as divinyl benzene.

The density of the final ceramic part may vary, as explained above. In general (without limitation), absolute densities ranging from about 0.1 $g/cm^3$ to about 5 $g/cm^3$, such as about 1-3 $g/cm^3$, may be produced. A fully dense ceramic may have a density from about 1 $g/cm^3$ to about 4 $g/cm^3$, for example.

The strength of the final ceramic material will vary, depending on the initial preceramic resin formulation, as well as the processing parameters. The engineering strength of a ceramic part also will depend on the geometry—such as a microtruss produced by some embodiments employing a self-propagating polymer waveguide technique. It is noted that, for instance, silicon oxycarbide microlattice and honeycomb cellular materials fabricated with the present methods exhibit higher strength than ceramic foams of similar density.

The thermal stability of the final ceramic material will vary, depending primarily on the initial preceramic resin formulation, as well as the processing parameters. In some embodiments, for example, the ceramic structure is characterized by being stable in the presence of air at a temperature of about 1000° C., 1100° C., 1200° C., 1300° C., 1400° C., 1500° C., 1600° C., 1700° C., or 1800° C.

The final ceramic structure, even when no machining, polishing, bonding, surface finishing, or assembly is required, may be subjected to coloring (e.g., with inks or dyes), stamping, or other non-functional features, if desired.

The following examples exhibit some embodiments of the present invention. Also, reference is made to experimental data published in Eckel et al., "Additive Manufacturing of Polymer-Derived Ceramics," *Science*, Jan. 1, 2016, Vol. 351, Issue 6268, pages 58-62, which is hereby incorporated by reference herein, pertaining to certain embodiments of this disclosure.

EXAMPLES

Example 1

Preceramic Stereolithography-Printed Polymer For Fabrication of 3D Ceramic Structure A monomer mixture containing 100 parts of vinylmethoxysiloxane polymer, 100 parts of (mercaptopropyl)methylsiloxane polymer, 0.5 parts of 2,2-dimethyl-2-phenylacetophenone, 0.15 parts tert-butylhydroquinone, and 0.25 parts 2,2'-(2,5-thiophenediyl)bis(5-tert-butylbenzoxazole) (all parts by weight), is thoroughly stirred or blended to make sure the components are well-mixed and the mixture is a uniform system. The material mixture is then readily used for the stereolithography. The 3D print is performed using a Formlabs 1, SLA (Formlabs, Somerville, Mass., U.S.) with laser wavelength at 405 nm. The step size is 100 microns, and the resin setting is "Flexible."

Figure 2:
FIG. 2 shows a side-view photograph of the preceramic polymer part, in Example 1.

The preceramic resin formulation is printed into a preceramic polymer part. FIG. 1 shows a top-view photograph of the preceramic polymer part, while FIG. 2 shows a side-view photograph of the preceramic polymer part.

Figure 3:
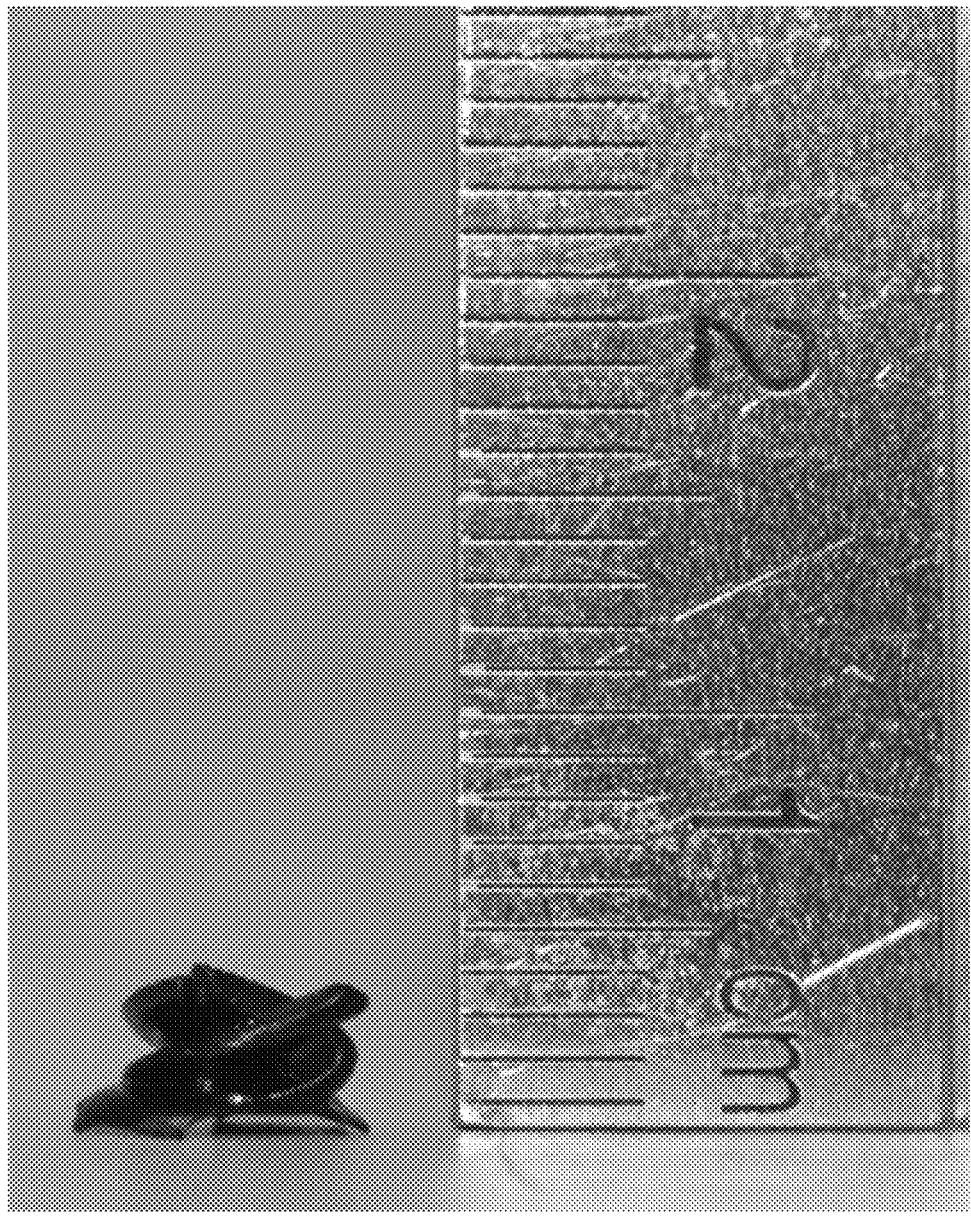
FIG. 3 shows a side-view photograph of the ceramic part resulting from the pyrolysis, in Example 1.

The preceramic polymer part is then thermally treated with pyrolysis (inert atmosphere) at a temperature of 1000° C. for about 1 hour. FIG. 3 shows a side-view photograph of the ceramic part resulting from the pyrolysis. Approximately uniform shrinkage is observed (FIG. 3 compared to FIG. 2). The steps from the layer-by-layer print can be seen in all three pictures (FIGS. 1, 2, and 3).

In this example, the direct, near-net-shaped conversion of a preceramic 3D-printed polymer structure to a ceramic structure is achieved by pyrolysis to produce the ceramic 3D structure shown in FIG. 3.

The versatility and the applications of these preceramic resin formulations make them especially useful. A variety of applications in the automotive and aerospace industries, among others, may benefit from the ability to 3D-print high-strength and high-temperature ceramic structures which can be derived from the disclosed formulations. These ceramic 3D parts or materials may be used for lightweight, high-temperature structural applications or for other applications that utilize the unique microstructures, such as (but not limited to) jet engine nozzles, nose cones, catalyst support, engine components, and microelectromechanical systems and devices.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A preceramic resin formulation comprising:
   (a) first molecules comprising two or more C=X double bonds, two or more CX triple bonds, or at least one C=X double bond and at least one CX triple bond, wherein X is selected from the group consisting of C, S, N, O, and combinations thereof, and wherein said first molecules further comprise at least one non-carbon atom selected from the group consisting of Si, B, Al, Ti, Zn, P, Ge, S, N, O, and combinations thereof;
   (b) second molecules comprising R—Y—H, wherein R is an organic group or an inorganic group containing an element selected from the group consisting of B, Al, Ti, Zn, P, Ge, S, N, and combinations thereof, and wherein R does not contain O, and wherein Y is selected from the group consisting of S, N, O, and combinations thereof;
   (c) a photoinitiator;
   (d) a free-radical inhibitor; and
   (e) a 3D-printing resolution agent.

2. The preceramic resin formulation of claim 1, wherein said first molecules are present from about 3 wt % to about 97 wt % of said formulation.

3. The preceramic resin formulation of claim 1, wherein at least one of said double bonds or said triple bonds is located at a terminal position of said first molecules.

4. The preceramic resin formulation of claim 1, wherein said first molecules comprise one or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof.

5. The preceramic resin formulation of claim 4, wherein said first molecules comprise two or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof.

6. The preceramic resin formulation of claim 1, wherein said second molecules are present from about 0.1 wt % to about 97 wt % of said formulation.

7. The preceramic resin formulation of claim 6, wherein said second molecules contain, or are contained within, one or more functional groups selected from the group consisting of thiol, alkyl, ester, amine, hydroxyl, and functional analogs thereof.

8. The preceramic resin formulation of claim 1, wherein at least 10% of said R is inorganic.

9. The preceramic resin formulation of claim 1, wherein said photoinitiator is present from about 0.001 wt % to about 10 wt % of said formulation.

10. The preceramic resin formulation of claim 1, wherein said photoinitiator is selected from the group consisting of 2,2-dimethoxy-2-phenylacetophenone, 2-hydroxy-2-methylpropiophenone, camphorquinone, bis(2,4,6-trimethylbenzoyl)-phenylphosphineoxide, benzophenone, benzoyl peroxide, dicumyl peroxide, 2,2'-azobisisobutyronitrile, and combinations or derivatives thereof.

11. The preceramic resin formulation of claim 1, wherein said formulation further includes a thermal free-radical initiator.

12. The preceramic resin formulation of claim 1, wherein said formulation further includes a radiation-trigger free-radical initiator active at a wavelength substantially different from said photoinitiator.

13. The preceramic resin formulation of claim 1, wherein said free-radical inhibitor is present from about 0.001 wt % to about 10 wt % of said formulation.

14. The preceramic resin formulation of claim 1, wherein said free-radical inhibitor is selected from the group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations or derivatives thereof.

15. The preceramic resin formulation of claim 1, wherein said 3D-printing resolution agent is present from about 0.001 wt % to about 10 wt % of said formulation.

16. The preceramic resin formulation of claim 1, wherein said 3D-printing resolution agent is selected from UV absorbers, fluorescent molecules, optical brighteners, or combinations thereof.

17. The preceramic resin formulation of claim 1, wherein said 3D-printing resolution agent is selected from the group consisting of 2-(2-hydroxyphenyl)-benzotriazole, 2-hydroxyphenyl-benzophenones, 2-hydroxyphenyl-s-triazines, 2,2'-(2,5- thiophenediyl)bis(5-tert-butylbenzoxazole), 2,2'-(1,2-ethenediyl)bis(4,1-phenylene)bisbenzoxazole, and combinations or derivatives thereof.

18. A preceramic resin formulation comprising:
   (a) first molecules comprising two or more C=X double bonds, two or more CX triple bonds, or at least one C=X double bond and at least one CX triple bond, wherein X is selected from the group consisting of C, S, N, O, and combinations thereof, and wherein said first molecules further comprise at least one non-carbon atom selected from the group consisting of Si, B, Al, Ti, Zn, P, Ge, S, N, O, and combinations thereof;
   (b) second molecules comprising R—Y—H, wherein R is an inorganic group, wherein for at least one of said second molecules, R contains an element selected from the group consisting of B, Al, Ti, Zn, P, Ge, S, N, and combinations thereof, wherein R does not contain O, and wherein Y is selected from the group consisting of S, N, O, and combinations thereof;

(c) a photoinitiator;

(d) a free-radical inhibitor; and (e) a 3D-printing resolution agent.

19. The preceramic resin formulation of claim 18, wherein said first molecules are present from about 3 wt % to about 97 wt % of said formulation.

20. The preceramic resin formulation of claim 18, wherein said first molecules comprise one or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof.

21. The preceramic resin formulation of claim 20, wherein said first molecules comprise two or more functional groups selected from the group consisting of vinyl, ethynyl, vinyl ether, vinyl ester, vinyl amide, vinyl triazine, vinyl isocyanurate, acrylate, methacrylate, diene, triene, and functional analogs thereof.

22. The preceramic resin formulation of claim 18, wherein said second molecules are present from about 0.1 wt % to about 97 wt % of said formulation.

23. The preceramic resin formulation of claim 18, wherein said photoinitiator is present from about 0.001 wt % to about 10 wt % of said formulation.

24. The preceramic resin formulation of claim 18, wherein said photoinitiator is selected from the group consisting of 2,2-dimethoxy-2-phenylacetophenone, 2-hydroxy-2-methylpropiophenone, camphorquinone, bis(2,4,6-trimethylbenzoyl)-phenylphosphineoxide, benzophenone, benzoyl peroxide, dicumyl peroxide, 2,2'-azobisisobutyronitrile, and combinations or derivatives thereof.

25. The preceramic resin formulation of claim 18, wherein said formulation further includes a thermal free-radical initiator.

26. The preceramic resin formulation of claim 18, wherein said formulation further includes a radiation-trigger free-radical initiator active at a wavelength substantially different from said photoinitiator.

27. The preceramic resin formulation of claim 18, wherein said free-radical inhibitor is present from about 0.001 wt % to about 10 wt % of said formulation.

28. The preceramic resin formulation of claim 18, wherein said free-radical inhibitor is selected from the group consisting of hydroquinone, methylhydroquinone, ethylhydroquinone, methoxyhydroquinone, ethoxyhydroquinone, monomethylether hydroquinone, propylhydroquinone, propoxyhydroquinone, tert-butylhydroquinone, n-butylhydroquinone, and combinations or derivatives thereof.

29. The preceramic resin formulation of claim 18, wherein said 3D-printing resolution agent is present from about 0.001 wt % to about 10 wt % of said formulation.

30. The preceramic resin formulation of claim 18, wherein said 3D-printing resolution agent is selected from UV absorbers, fluorescent molecules, optical brighteners, or combinations thereof, and wherein said 3D-printing resolution agent is optionally selected from the group consisting of 2-(2-hydroxyphenyl)-benzotriazole, 2-hydroxyphenyl-benzophenones, 2-hydroxyphenyl-s-triazines, 2,2'-(2,5-thiophenediyl)bis(5-tert-butylbenzoxazole), 2,2'-(1,2-ethenediyl)bis(4,1-phenylene)bisbenzoxazole, and combinations or derivatives thereof.

* * * * *